United States Patent [19]
Roberson

[11] 3,954,522
[45] May 4, 1976

[54] INTEGRATED CIRCUIT PROCESS
[75] Inventor: Donald K. Roberson, Scottsdale, Ariz.
[73] Assignee: Motorola, Inc., Chicago, Ill.
[22] Filed: June 28, 1973
[21] Appl. No.: 374,719

[52] U.S. Cl................................. 148/175; 29/577; 29/580; 148/174; 148/191; 357/44; 357/49; 357/50; 357/59; 156/600
[51] Int. Cl.².................. H01L 21/76; H01L 29/04
[58] Field of Search................... 148/174, 175, 191; 317/235 IE, 235 F; 29/577, 580; 117/201, 212, 215; 357/49, 50

[56] References Cited
UNITED STATES PATENTS

| | | | |
|---|---|---|---|
| 3,454,835 | 7/1969 | Rosvold | 317/235 X |
| 3,587,166 | 6/1971 | Alexander et al. | 29/577 |
| 3,725,146 | 4/1973 | Roder | 148/175 |

FOREIGN PATENTS OR APPLICATIONS

| | | | |
|---|---|---|---|
| 1,421,618 | 11/1965 | France | 148/175 |

OTHER PUBLICATIONS
Wu, B. P. F., "Semiconductor Fabrication... of Integrated Circuits", I.B.M. Tech. Discl. Bull., Vol. 8, No. 12, May 1966, pp. 1846–1847.
Stern, E., "Planar Scanistor Arrays", Ibid., Vol. 7, No. 11, Apr. 1965, pp. 1101–1102.
Stern et al., "Fabrication of Planar... By Insulating Barriers", Ibid., Vol. 7, No. 11, Apr. 1965, p. 1103.
Thornton, C. G., "Metal Bathtubs in Microcircuits Reduce Collector Resistance", Electronic Equipment Engin. Dec. 1964, pp. 18–20.

Primary Examiner—L. Dewayne Rutledge
Assistant Examiner—W. G. Saba
Attorney, Agent, or Firm—Henry T. Olsen; Harry M. Weiss

[57] ABSTRACT
In the manufacture of semiconductor components, more radiation tolerant semiconductors are accomplished by growing a uniform epitaxial collector region on a dielectrically isolated substrate havin g islands of high conductivity semiconductor material.

3 Claims, 7 Drawing Figures

INTEGRATED CIRCUIT PROCESS

BACKGROUND OF THE INVENTION

This invention relates to a method of producing monolithic integrated circuits and more particularly to radiation hardened monolithic bipolar linear integrated circuits.

Radiation hardening of semiconductor devices as used herein and in accordance with terminology in the art means to design and process semiconductor devices so that the affects of nuclear radiation to which the device may be exposed only minimally affects the performance of the device. As a general rule, improved radiation performance of a device will be obtained by reducing its size since the transient radiation may be assumed to impinge into its total volume and the larger the volume the greater the total transient radiation response. However, no matter how small the device is made, it must have some finite surface area on which radiation can impinge and modify the operation of the device and hence the circuit in which it operates. While the radiation may cause various spurious responses in the device, one of the main problems is induced photocurrents caused by the impinging transient radiation.

Gamma radiation produces large numbers of electron hole pairs both in the semiconductor body and in the dielectric used for surface passivation and isolation. In the passivating layer, most electrons either recombine with holes or escape through the metalization or to the semiconductor, but some holes will be trapped and contribute to a relatively permanent net positive charge. In the high conductivity bulk silicon, the electron-hole pairs recombine and have minor electrical affect in this short lifetime semiconductor material. However, in long lifetime material, such as used in the collectors of bipolar transistors, the electrons and holes may move in an "E" field or drift toward a PN junction where they are separated and appear as junction photocurrents. To minimize this photocurrent, it is necessary to provide a minimum collector thickness determined by the width of the depletion region at the collector base under a given maximum reverse voltage. This thickness criterion maximizes the doping for a given voltage rating. Thus, precise control of collector resistivity and thickness is essential.

In accordance with prior art processing of integrated circuits, it has been conventional to increase the doping concentration in selected areas of the surface of a semiconductor wafer to provide a buried layer. Then by selective etching and oxidizing steps, passivated moats are provided in the surface of the wafer. Then a polycrystalline silicon handle is deposited. The starting semiconductor substrate is then mostly removed to separate the semiconductor material into dielectrically isolated islands having the starting material conductivity at the surface and the more highly doped material appearing laterally across the bottom of the dielectrically isolated island. During the lapping and polishing of the starting substrate and the handle, it is virtually impossible to maintain the previous thickness of the starting material from island to island, especially from one side of the wafer to the other, or, in fact, even within the island itself. Since this material in general forms the collector region for a transistor, the nonuniform collector region is susceptible to the radiation affects aforementioned, resolves in induced photocurrents, and varies greatly from one device to the other relating to the difference in the thicknesses of the long lifetime collector volume.

SUMMARY OF THE INVENTION

Therefore, it is an object of this invention to provide a method for manufacturing improved radiation hardened semiconductor devices and circuits.

A further object of the invention is to provide a dielectrically isolated integrated circuit having more absolute and uniform collector thicknesses of the long lifetime volume with less variation from device to device.

Still more particularly, it is an object of this invention to provide a method of manufacturing bipolar linear complementary integrated circuits which are more radiation tolerant, than built by the prior art.

In accordance with these objects, there is provided a method of manufacturing a semiconductor device which comprises the steps of providing a dielectrically isolated substrate having highly doped semiconductor regions dielectrically isolated one from the other therein and epitaxially depositing a uniform epitaxial layer thereon to form the long life time collector regions for the transistors to be manufactured therein.

THE DRAWINGS

Further objects and advantages of the invention will be understood from the following complete description thereof and from the drawings wherein.

DETAILED DESCRIPTION

Figure 1:
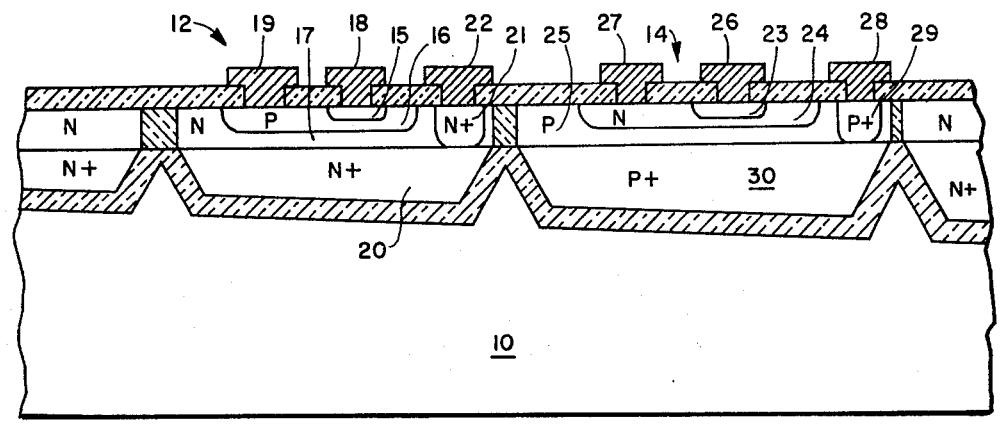
FIG. 1 is a cross section of a monolithic integrated circuit made in accordance with the invention and showing the uniformity in the long lifetime collector material, noting the volume variance in the short lifetime buried layer.

In accordance with the invention as shown in FIG. 1, a portion of an integrated circuit is shown in cross section and includes a substrate 10 having a NPN transistor 12 and a PNP transistor 14 in dielectrically isolated islands therein. The NPN transistor 12 includes an emitter 15, a base 16 and a collector 17. Contacts 18 and 19 form electrical connections to the emitter 15 and base 16 respectively. While not depicted, the base region may include a base enhancement region underlying the contact 19. Collector contact is made through a buried layer region 20, a deep collector diffusion 21 and a contact 22 on the surface of the integrated circuit.

Similarly, the PNP transistor 14 has an emitter 23, a base 24 and collector 25. Contact to the respective regions is made through an emitter contact 26, a base contact 27, and a collector contact 28 through a deep diffusion 29 and a buried layer 30. Since manufactured in accordance with the invention, it will be noted that the collector region 17 between the base regions 16 and buried layer 20 has a uniform thickness and similarly the collector region 25 between base region 24 and buried layer region 30 has a uniform thickness. While the buried layer regions 20 and 30 are not uniform in thickness, this factor does not significantly hamper operation of the resultant integrated circuit since these are high conductivity, low lifetime regions which generate minimal deliterious photocurrents.

Figure 2:
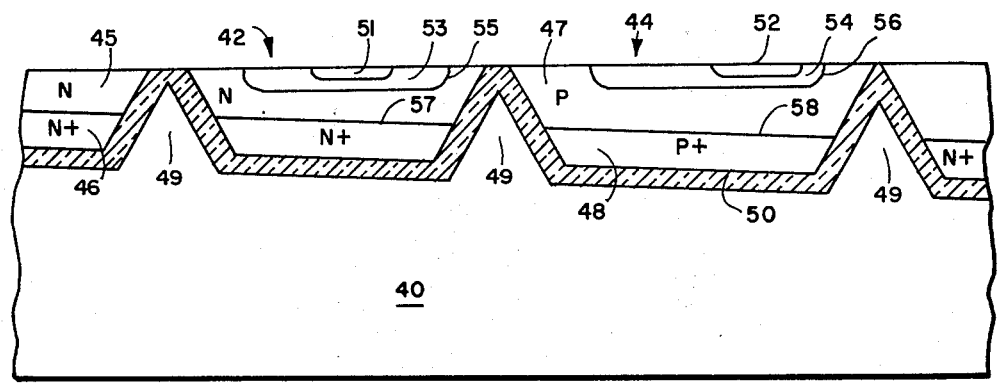
FIG. 2 is a similar cross section of an integrated circuit made in accordance with the prior art and showing the variance in the long lifetime collector material as well as the lack of adequate controls on the absolute thickness and volume of the long lifetime collector body.
Figure 7:
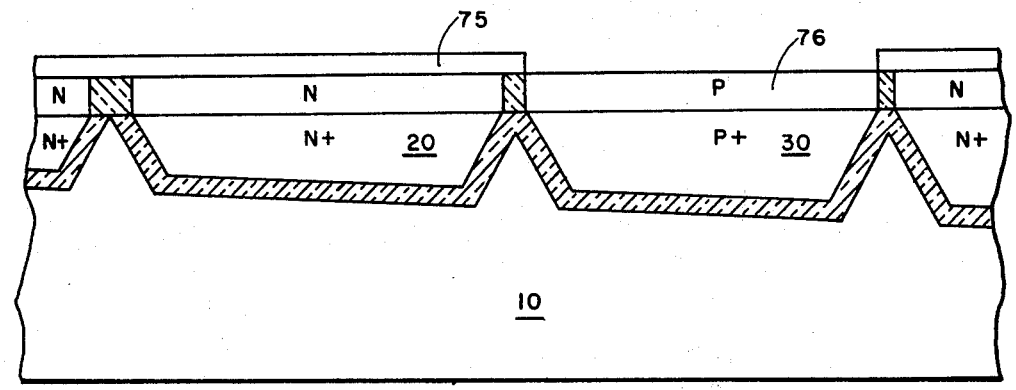
FIGS. 3 to 7 show cross sections of the integrated circuit of FIG. 1 in successive stages of processing.

The foregoing structure is contrasted with the prior art as depicted in FIG. 2 and wherein a substrate 40 has an NPN transistor 42 and a PNP transistor 44 located in dielectrically isolated islands therein, the passivation layers and contacts of the respective devices not being shown. The FIG. 2 structure is manufactured by the prior art dielectrically isolated integrated circuit technique of starting with an N-conductivity substrate material 45 into or onto which an N+ buried layer 46 is either diffused into or epitaxially deposited onto the substrate. By etch out and epitaxial refill techniques, a P-type region 47 is formed in the substrate and a buried layer region 48 is placed into or onto the surface thereof. The starting wafer is then suitably etched to form the isolation notches 49 and a dielectric layer 50 covers the entire surface of the starting wafer. A polycrystalline handle 40 is then deposited over the entire surface of the dielectric layer 50 to form a substrate handle for the ultimate integrated circuit. Following the placement of the handle 40 thereon, substantially all of the starting material 45 is eliminated by a lapping and polishing technique to form the isolated islands shown, and by standard diffusion techniques, emitters 51 and 52 and bases 53 and 54 are formed in the isolated islands or tubs. Due to the inadequacy of the polishing techniques, it is virtually impossible to have the depth of the buried layers 46 and 48 uniformly spaced beneath the newly formed lapped surface of the wafer prior to diffusions. Thus, when the bases 53 and 54 are diffused into the collector regions 45 and 47, the base-collector junctions 55 and 56 are not uniformly spaced from the collector-buried layer boundaries 57 and 58. Because of this defect in the manufacturing process, the devices are more susceptible to radiation induced photocurrents than is desirable.

Figure 3:
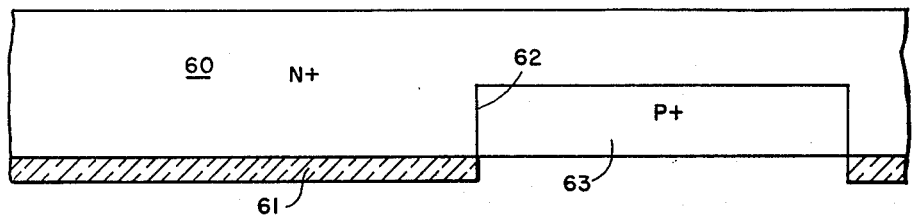
Figure 4:
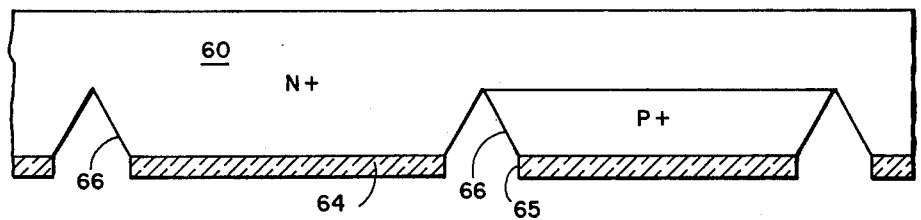

A preferred succession of steps in the process in accordance with the invention is depicted in FIGS. 3 to 7. The process is begun by providing a semiconductor wafer preferably of silicon having N+ conductivity type and concentration. As used herein, a plus is utilized to indicate concentrations in the range of $10^{17}$ to $10^{22}$ atoms per cc, whereas N-conductivity would have a concentration of approximately $10^{15}$ to $10^{16}$ atoms per cc. As depicted in FIG. 3, the starting wafer 60 is in what might be considered an inverted position for clarity through the successive steps of the process. The lower surface of the starting wafer 60 is suitably covered with a masking layer 61 and a pit 62 is etched therein which is then refilled with an epitaxial layer 63 which is of a P+ conductivity of the desired dopant concentration. Then as shown in FIG. 4, following removal of the masking layer 61, a new masking layer 64 is suitably patterned with windows 65. The wafer is then suitably etched with either an anisotropic or isotropic etchant to form either the V-shaped anisotropic or arched isotropic notches 66. It must be noted that these notch shapes are uniform in any given substrates, that is they will all be either V-shaped or arch shaped depending upon the silicon grain orientation and etchant used.

Figure 5:
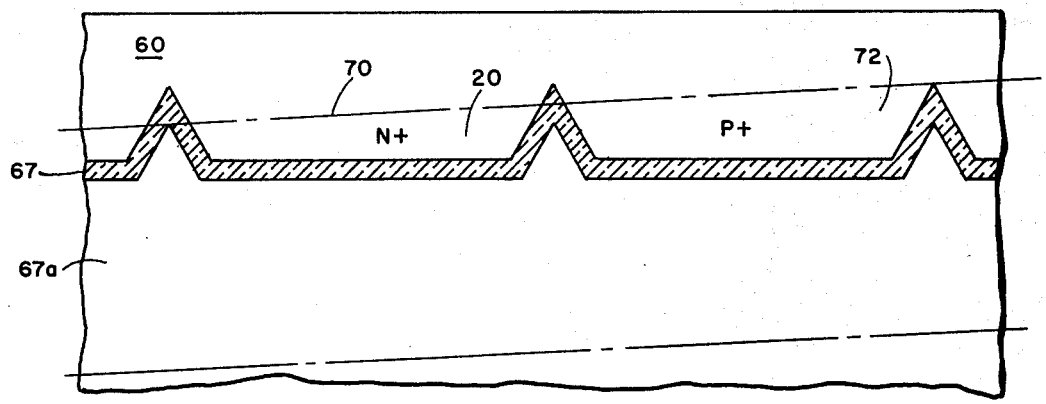
Figure 6:
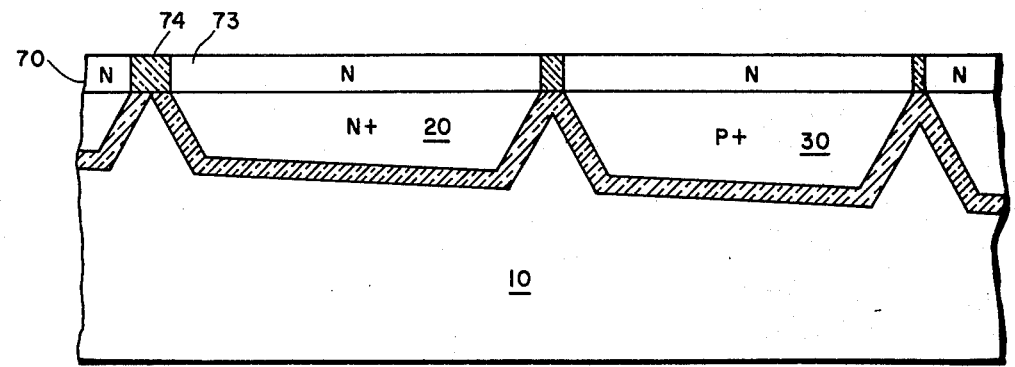

Following the forming of notches 66 and masking layer 64 being removed, the entire surface of the starting substrate 60 is covered with a dielectric layer 67 (FIG. 5). The dielectric layer 67 may be a single layer of, for example, silicon dioxide or may be a multiple layer of silicon dioxide and silicon nitride. A polycrystalline silicon handle 67a is then deposited upon the dielectric layer 67. As depicted in FIG. 5 (somewhat exaggerated), the upper surface 68 of the polycrystalline silicon layer 67a will be somewhat uneven due to the thick buildup of material. Thus, it is necessary to lap the surface 68 to a new surface depicted by lap line 69. The angle at which lap line 69 is oriented with respect to the original surface of the starting substrate 60 introduces an error which effects the radiation tolerance of the ultimate circuits. Following forming of the surface along lap line 69, most of the starting substrate 60 is removed along lap line 70 which for convenience is shown as being parallel to lap line 69. It will be appreciated that an actual practice, a certain amount of error is produced in forming the surface along lap line 69 and further error is introduced along lap line 70. In any case, following the lapping steps, the original N+ material forms islands such as island 20 and the epitaxially deposited P+ material forms an island such as 30 each of which will become dielectrically isolated from each other but which may not have a uniform thickness. The wafer is shown reoriented to its surfaces 69 and 70 in FIG. 6 thus clearly depicting the nonuniform thickness of the high conductivity material in the bottoms of the islands. To this substrate is then applied an epitaxial layer 73 of, for example, N-conductivity material, the epitaxial layer forming as monocrystalline material over the monocrystalline islands 20 and 30 but being polycrystalline silicon 74 over the dielectric 67 or polycrystalline silicon 67a exposed at the surface 70 of the wafer. This polycrystalline silicon 74 may be removed later if more complete dielectric isolation is to be provided. To complete the formation of the complimentary integrated circuit substrate, the wafer is provided with a suitable masking layer 75 (FIG. 7) and the N-conductivity material of layer 73 over the island of P+ material 30 is either removed by etching in a suitable etch and a P-conductivity epitaxial layer is redeposited therein or an alternate method would be to diffuse P-type dopant thru the N-layer to the P-buried layer. Note if the etch out and epitaxial refill method is used, it will be necessary to remove a thin layer of polycrystalline silicon which would have been deposited over the oxide 75 during the P-epitaxial refill to re-achieve a planar surface.

Applications of this invention can also be used in a non-radiation environment as well, where circuit performance may require similar controls and isolation of the material. The polycrystalline silicon growth shown as 74 (FIG. 6) is removed by selectively removing the passivation layer over the polycrystalline silicon followed by an etch of the silicon until the lower layer of dielectric material in the isolation notches is received. This etched pit is then passivated with $SiO_2$ or $Si_3N_4$ or a combination of both 77 (FIG. 1). The surface is again replanarized by epitaxially refilling the remaining volume of this pit with polycrystalline silicon 78 (FIG. 1) followed by a slight mechanical lap to remove the deposited polycrystalline silicon from the surface of the circuit passivation 79 (FIG. 1).

While the invention has been disclosed by way of the preferred embodiment thereof, it will be appreciated that suitable modifications may be made therein without departing from the spirit and scope of the invention. For example, while the preferred embodiment of the invention has been disclosed as manufacturing a complimentary bipolar integrated circuit, it will be appreciated that the process may be utilized for the formation of dielectrically isolated noncomplimentary integrated circuits or MOS integrated circuits of either noncomplimentary or complimentary types.

What is claimed is:

1. A method of manufacturing a monolithic integrated circuit comprising the steps of:
   a. providing a starting substrate of silicon semiconductor material having a high conductivity of a first type;
   b. masking and etching a first surface of said starting substrate to form notches;
   c. covering the notched surface of said starting substrate with a dielectric layer;
   d. depositing a polycrystalline silicon handle on the dielectric layer;
   e. lapping the second surface of the starting substrate to expose the dielectric layer in the notches and form islands; and
   f. epitaxially depositing a layer of monocrystalline silicon of the same conductivity on the remaining surface of the starting substrate while forming insulatory polycrystalline silicon on the areas above the exposed dielectric layer.

2. A method as recited in claim 1 wherein said islands of high conductivity material have doping concentrations of between $10^{17}$ and $10^{21}$ atoms/cc. and same epitaxial layer has a doping concentration of about $10^{15}$ to $10^{16}$ atoms/cc.

3. A method as recited in claim 2 wherein said islands of high conductivity semiconductor material include at least one island of the opposite conductivity and further including the steps of converting the portion of the epitaxial layer of the same conductivity type overlying the island of the opposite conductivity type to opposite conductivity material.

* * * * *